United States Patent
Huang et al.

(10) Patent No.: US 8,884,677 B1
(45) Date of Patent: Nov. 11, 2014

(54) GAMMA OPERATIONAL AMPLIFIER CIRCUIT, SOURCE DRIVER AND METHOD FOR ELIMINATING VOLTAGE OFFSET

(71) Applicant: Himax Technologies Limited, Tainan (TW)

(72) Inventors: Hung-Yu Huang, Tainan (TW); Chuan-Chien Hsu, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 14/083,414

(22) Filed: Nov. 18, 2013

(51) Int. Cl.
- *H03L 5/00* (2006.01)
- *H03K 5/007* (2006.01)
- *H03K 17/00* (2006.01)

(52) U.S. Cl.
CPC .............. *H03K 5/007* (2013.01); *H03K 17/002* (2013.01)
USPC ........................................................ 327/307

(58) Field of Classification Search
CPC . G09G 3/3614; G09G 3/3688; G09G 3/3696; G09G 2310/027; G09G 2320/0673
USPC ....................................................... 327/307
See application file for complete search history.

(56) References Cited

U.S. PATENT DOCUMENTS

| | | | |
|---|---|---|---|
| 6,970,152 B1* | 11/2005 | Bell et al. ........................ | 345/100 |
| 7,098,823 B2* | 8/2006 | O'Dowd et al. ............... | 341/118 |
| 7,432,922 B2* | 10/2008 | Chang et al. ................... | 345/212 |
| 8,427,459 B2* | 4/2013 | Song et al. ..................... | 345/204 |
| 8,593,389 B2* | 11/2013 | Yen et al. ........................ | 345/100 |
| 2007/0075952 A1* | 4/2007 | Hamahashi et al. ............ | 345/89 |
| 2012/0319931 A1* | 12/2012 | Wang ............................... | 345/84 |
| 2013/0100004 A1* | 4/2013 | Lee et al. ........................ | 345/89 |

* cited by examiner

*Primary Examiner* — William Hernandez
(74) *Attorney, Agent, or Firm* — CKC & Partners Co., Ltd.

(57) ABSTRACT

A gamma operational amplifier circuit, a source driver, and a method for eliminating voltage offset are disclosed. The gamma operational amplifier circuit includes a first switch circuit, a second switch circuit, a first operational amplifier and a second operational amplifier. The source driver includes the gamma operational amplifier circuit, a resistor string and a digital-to-analog converter. The method for eliminating voltage offset includes a positive polarity control stage and a negative polarity control stage. In the method for eliminating voltage offset, the positive polarity control stage and the negative polarity control stage control the first switch circuit and the second switch circuit to change paths at which a first reference voltage and a second reference voltage pass through to enable the first reference voltage and a second reference voltage to pass different operational amplifiers in different polarity control stage.

11 Claims, 7 Drawing Sheets

GAMMA OPERATIONAL AMPLIFIER CIRCUIT, SOURCE DRIVER AND METHOD FOR ELIMINATING VOLTAGE OFFSET

FIELD

The present disclosure relates to a gamma operational amplifier circuit, a source driver and a method for eliminating voltage offset, and more particularly, to a gamma operational amplifier circuit, a source driver and a method for eliminating an offset between gamma reference voltages.

BACKGROUND

Referring to FIG. 1, FIG. 1 is block diagram showing a structure of a source driver 10 of a liquid display. The source driver 10 includes operational amplifiers $OP_1$-$OP_n$, a resistor string including resistors $R_1$-$R_n$, a digital-to-analog converter 14, an output buffer and a switch circuit. The source driver 10 obtains a plurality of reference voltages $VR_1$-$VR_n$ from a reference voltage supply (not shown), and receives the pixel values transmitted by the channels $ch_1$-$ch_n$ to convert the pixel values into the analog driving voltages, and sends in parallel the analog driving voltages on these channels to a set of corresponding data lines in accordance with scanning timing and data polarity inversion timing.

Each of the operational amplifiers $OP_1$-$OP_n$ is used as an input buffer for each of the reference voltages $VR_1$-$VR_n$. After being received and outputted by the buffers, the reference voltages are divided by the resistors $VR_1$-$VR_n$, and thus two sets of gamma voltages with positive and negative data polarity are generated respectively. These gamma voltages are then input to the digital-to-analog converter 14. The digital-to-analog 14 may output a corresponding gamma voltage of the two sets of gamma voltages for each channel, based on the pixel value and data polarity of the channel. The voltage output by the digital-to-analog converter 14 is then output as a driving voltage via the output buffer 16. The switch circuit 18 is used to switch the connection between the output channels in conjunction with the data polarity inversion timing, so as to implement different driving modes, such as frame inversion, row inversion, column inversion, dot inversion or two dot lines inversion and the like.

However, since the operational amplifiers have inherent output voltage offsets and the inherent output voltage offsets are different from each other, the final driving voltages produced have different voltage offsets, too. Therefore, the distinct luminance or color difference occurs due to the different offsets in the driving voltages, and thus forming the so-called "band mura".

SUMMARY OF THE INVENTION

Accordingly, an aspect of the present invention is to a gamma operational amplifier circuit, a source driver and a method for eliminating voltage offset.

In accordance with embodiments of the present invention, the gamma operational amplifier circuit includes a first switch circuit, a first operational amplifier, a second operational amplifier, and a second switch circuit. The first switch circuit is configured to receive a first reference voltage and a second reference voltage. The first switch circuit includes a first input terminal configured to receive the first reference voltage, a second input terminal configured to receive the second reference voltage, a first output terminal configured to output one of the first reference voltage and the second reference voltage, and a second output signal configured to output the other of the first reference voltage and the second reference voltage. The first operational amplifier is electrically connected to first output terminal of the first switch circuit to output the one of the first reference voltage and the second reference voltage. The second operational amplifier is electrically connected to the second output terminal of the first switch circuit to output the other of the first reference voltage and the second reference voltage. The second switch circuit is electrically connected to the first operational amplifier and the second operational amplifier. The second switch circuit includes a second switch circuit electrically connected to the first operational amplifier and the second operational amplifier. The second switch circuit includes a first input terminal electrically connected to the first operational amplifier to receive the one of the first reference voltage and the second reference voltage, a second input terminal electrically connected to receive the other of the first reference voltage and the second reference voltage, a first output terminal configured to output the one of the first reference voltage and the second reference voltage, and a second output terminal configured to output the other of the first reference voltage and the second reference voltage.

In accordance with the other embodiments of the present invention, the source driver includes a first gamma operational amplifier circuit, a first resistor string and a digital-to-analog converter. The first gamma operational amplifier circuit includes a first switch circuit, a first operational amplifier, a second operational amplifier, and a second switch circuit. The first switch circuit is configured to receive a first reference voltage and a second reference voltage. The first switch circuit includes a first input terminal configured to receive the first reference voltage, a second input terminal configured to receive the second reference voltage, a first output terminal configured to output one of the first reference voltage and the second reference voltage, and a second output signal configured to output the other of the first reference voltage and the second reference voltage. The first operational amplifier is electrically connected to first output terminal of the first switch circuit to output the one of the first reference voltage and the second reference voltage. The second operational amplifier is electrically connected to the second output terminal of the first switch circuit to output the other of the first reference voltage and the second reference voltage. The second switch circuit is electrically connected to the first operational amplifier and the second operational amplifier. The second switch circuit includes a second switch circuit electrically connected to the first operational amplifier and the second operational amplifier. The second switch circuit includes a first input terminal electrically connected to the first operational amplifier to receive the one of the first reference voltage and the second reference voltage, a second input terminal electrically connected to receive the other of the first reference voltage and the second reference voltage, a first output terminal configured to output the one of the first reference voltage and the second reference voltage, and a second output terminal configured to output the other of the first reference voltage and the second reference voltage.

In accordance with another embodiments of the present invention, in the method for eliminating voltage offset, a first switch circuit, a second switch circuit, a first operational amplifier, and a second operational amplifier are provided at first. Then, a positive polarity control stage and a negative polarity control stage are performed. In the positive polarity control stage, at first, the first switch circuit is controlled to output a first reference voltage to the first operational amplifier through a first output terminal of the first switch circuit and to output a second reference voltage to the second operational amplifier through a second output terminal of the first switch circuit. Then, the first operational amplifier is used to output the first reference voltage to a first input terminal of the second switch circuit. Thereafter, the second operational amplifier is used to output a second input terminal of the second reference voltage to the second switch circuit. Then, the second switch circuit is controlled to output the first reference voltage through a first output terminal of the second switch circuit and to output the second reference voltage through a second output terminal of the second switch circuit.

In the negative polarity control stage, at first, the first switch circuit is controlled to output the first reference voltage to the first operational amplifier through the second output terminal of the first switch circuit and to output the second reference voltage to the second operational amplifier through the first output terminal of the first switch circuit. Then, the first operational amplifier is used to output the second reference voltage to the first input terminal of the second switch circuit. Thereafter, the second operational amplifier is used to output the first reference voltage the second input terminal of to the second switch circuit. Then, the second switch circuit is controlled to output the first reference voltage through the first output terminal of the second switch circuit and to output the second reference voltage through the second output terminal of the second switch circuit.

In the embodiments of the present invention, all the positive polarity signals before the data polarity inversion and all the negative polarity signals after the data polarity inversion pass through the same operational amplifier. Similarly, all the negative polarity signals before the data polarity inversion and all the positive polarity signals after the data polarity inversion pass through the same operational amplifier. Therefore, all the positive polarity signals before the data polarity inversion and all the negative polarity signals after the data polarity inversion have the same voltage offset, and all the negative polarity signals before the data polarity inversion and all the positive polarity signals after the data polarity inversion have the same voltage offset, thereby eliminating the "band mura".

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

Figure 1:
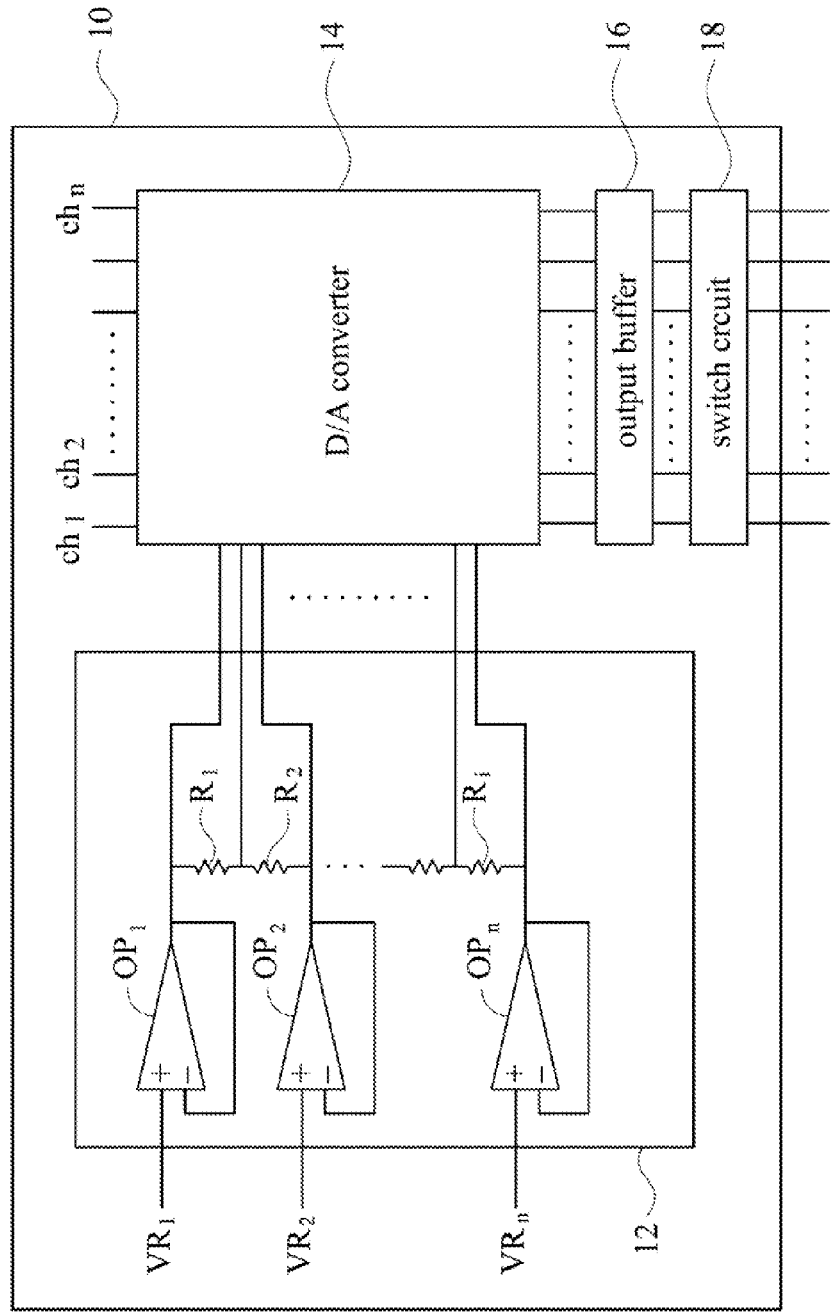
FIG. 1 is block diagram showing a structure of a source driver of a liquid display.
Figure 2:
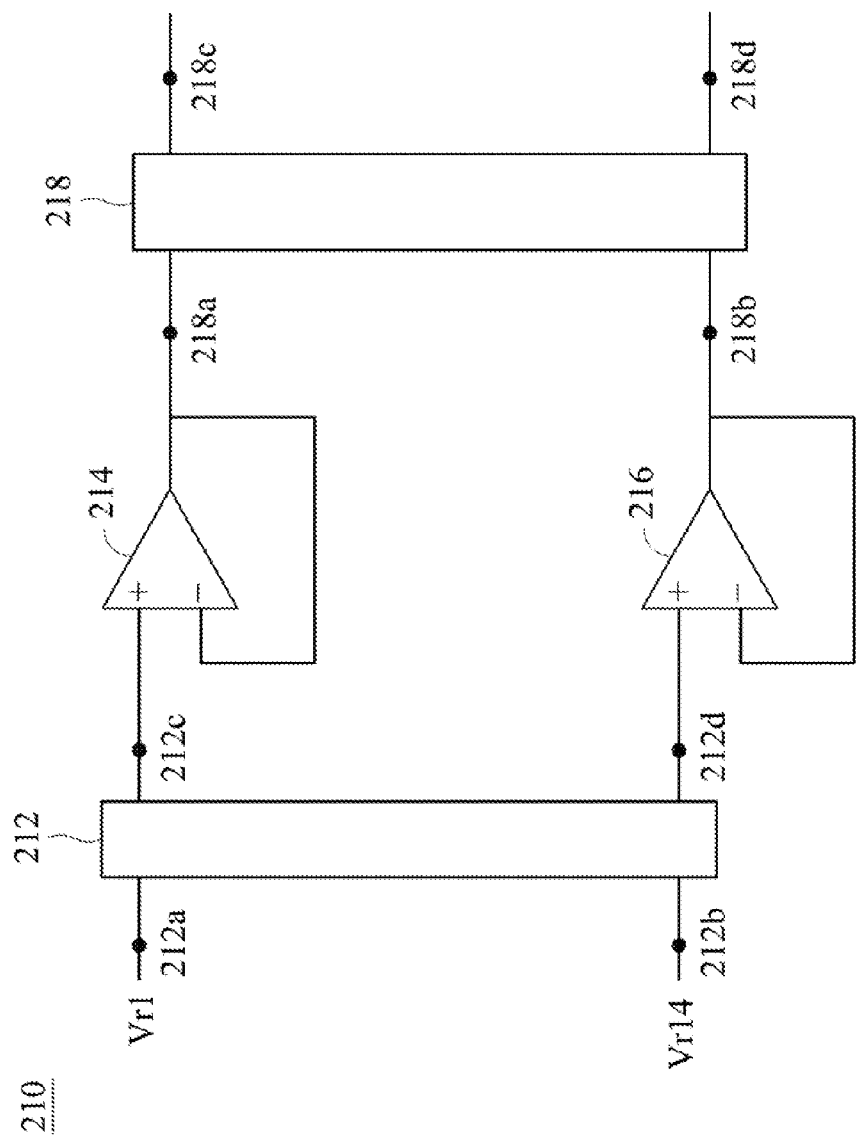
FIG. 2 is a circuit diagram showing a gamma operational amplifier circuit in accordance with embodiments of the present invention.

FIG. 2 is a circuit diagram showing a gamma operational amplifier circuit 210 in accordance with embodiments of the present invention. The gamma operational amplifier circuit 210 includes a first switch circuit 212, a first operational amplifier 214, a second operational amplifier 216 and a second switch circuit 218. The gamma operational amplifier circuit 210 is used as an input buffer for the reference voltages Vr1 and Vr14. In the present embodiments, the reference voltage Vr1 is used as a positive polarity signal and the reference voltages Vr14 is used as a negative polarity signal matching the positive polarity signal. In some other embodiments, the reference voltage Vr14 is used as a positive polarity signal and the reference voltages Vr1 is used as a negative polarity signal matching the positive polarity signal. Further, in the present embodiments, the first switch circuit and the second switch circuit are multiplexers, but the embodiments of the present invention are not limited thereto.

The first switch circuit 212 includes an input terminal 212a, an input terminal 212b, an output terminal 212c, and an output terminal 212d. The input terminals 212a and 212b are configured to receive the reference voltages Vr1 and Vr14, and the output terminals 212c and 212d are configured to output the reference voltages Vr1 and Vr14 to the first operational amplifier 214 and the second operational amplifier 216.

The first operational amplifier 214 and the second operational amplifier 216 receive the reference voltages Vr1 and Vr14 and then output the reference voltages Vr1 and Vr14 to the second switch circuit 218 to perform a buffer function for the reference voltages Vr1 and Vr14. In the present embodiments, the first operational amplifier 214 and the second operational amplifier 216 are rail-to-rail operational amplifiers.

The second switch circuit 218 includes an input terminal 218a, an input terminal 218b, an output terminal 218c, and an output terminal 218d. The input terminals 218a and 218b are configured to receive the reference voltages Vr1 and Vr14, and the output terminals 218c and 218d are configured to output the reference voltages Vr1 and Vr14.

Figure 2A:
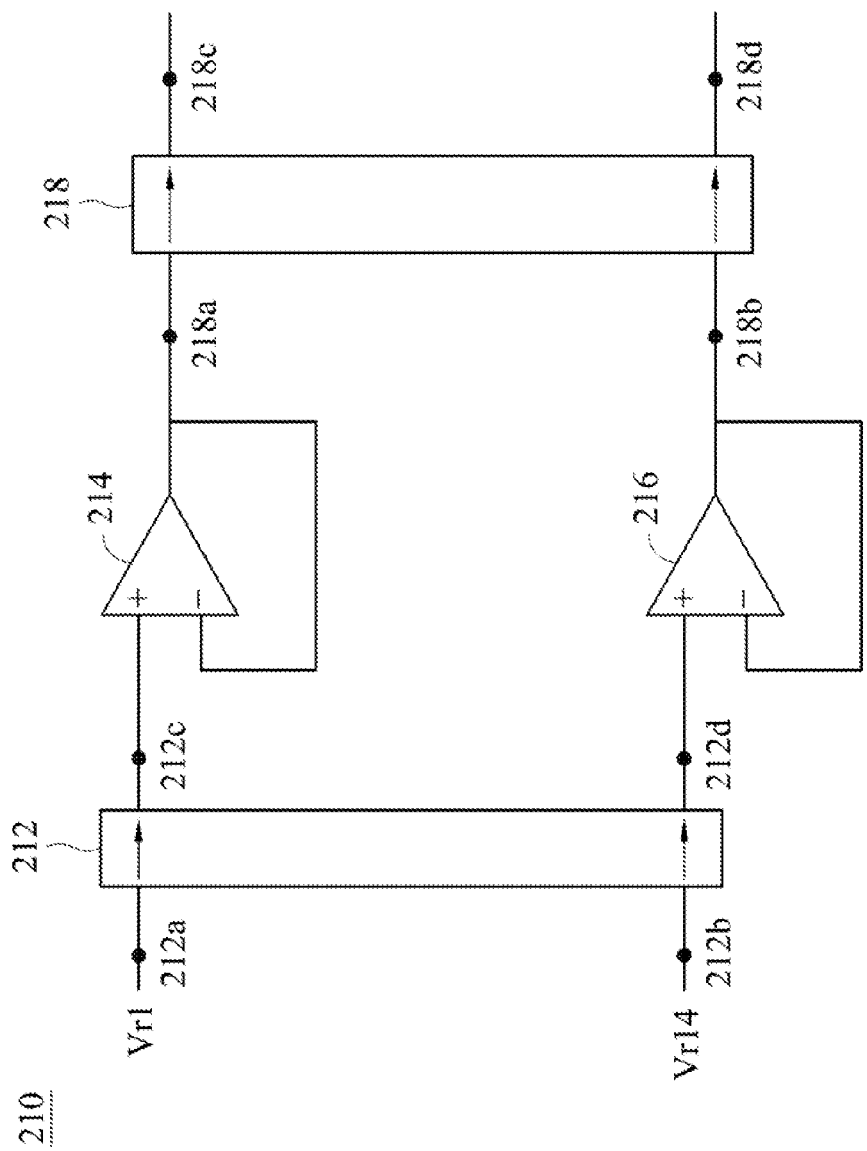
FIG. 2A and FIG. 2B are circuit diagrams showing the gamma operational amplifier circuit when being controlled in accordance with data polarity inversion timing.
Figure 2B:
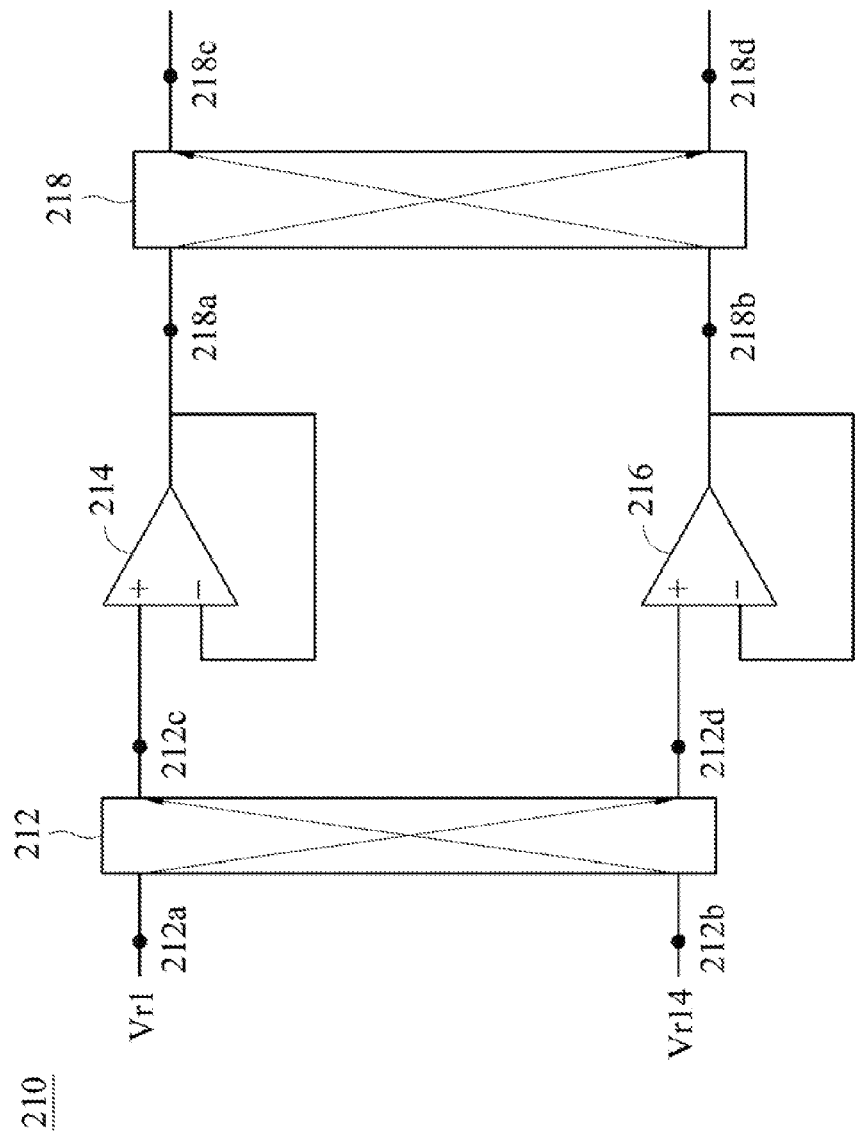

Referring to FIG. 2A and FIG. 2B, FIG. 2A and FIG. 2B are circuit diagrams showing the gamma operational amplifier circuit 210 when being controlled in accordance with data polarity inversion timing. As shown in FIG. 2A, the first switch circuit 212 is controlled to output the reference voltage Vr1 through the output terminal 212c and to output the reference voltage Vr14 through the output terminal 212d. The reference voltages Vr1 and Vr14 are respectively transmitted to the input terminals 218a and 218b of the second switch circuit 218 through the first operational amplifier 214 and the second operational amplifier 216 wherein the input terminal 218a receives the reference voltages Vr1 and the input terminal 218b receives the reference voltages Vr14. Then, the second switch circuit 218 is controlled to output the reference voltages Vr1 through the output terminal 218c and to output the reference voltage Vr14 through the output terminal 218d.

As shown in FIG. 2B, when the data polarity is inversed, the first switch circuit 212 is controlled to output the reference voltage Vr14 through the output terminal 212c and to output the reference voltage Vr1 through the output terminal 212d. The reference voltages Vr14 and Vr1 are respectively transmitted to the input terminals 218a and 218b of the second switch circuit 218 through the first operational amplifier 214 and the second operational amplifier 216, wherein the input terminal 218a receives the reference voltages Vr14 and the input terminal 218b receives the reference voltages Vr1.

Then, the second switch circuit 218 is controlled to output the reference voltages Vr1 through the output terminal 218c and to output the reference voltage Vr14 through the output terminal 218d.

In the present embodiment, the first switch circuit 212 and the second switch circuit 218 are controlled to enable the reference voltages Vr1 and Vr14 to pass through the same operational amplifier, and thus the reference voltages Vr1 and Vr14 have the same voltage offset. Since the reference voltages Vr1 and Vr14 have the same voltage offset, the "band mura" is eliminated accordingly.

For example, with respect to the first operational amplifier 214, at first, the reference voltages Vr1 passes through the first operational amplifier 214. Then, when the data polarity is inversed, the reference voltages Vr14 passes through the first operational amplifier 214. Therefore, the reference voltage Vr1 before data polarity inversion and the reference voltage Vr14 after data polarity inversion pass through the first operational amplifier 214. For another example, with respect to the second operational amplifier 216, at first, the reference voltages Vr14 passes through the second operational amplifier 216. Then, when the data polarity is inversed, the reference voltages Vr1 passes through the second operational amplifier 216. Therefore, the reference voltage Vr14 before data polarity inversion and the reference voltage Vr1 after data polarity inversion pass through the second operational amplifier 216.

Figure 3:
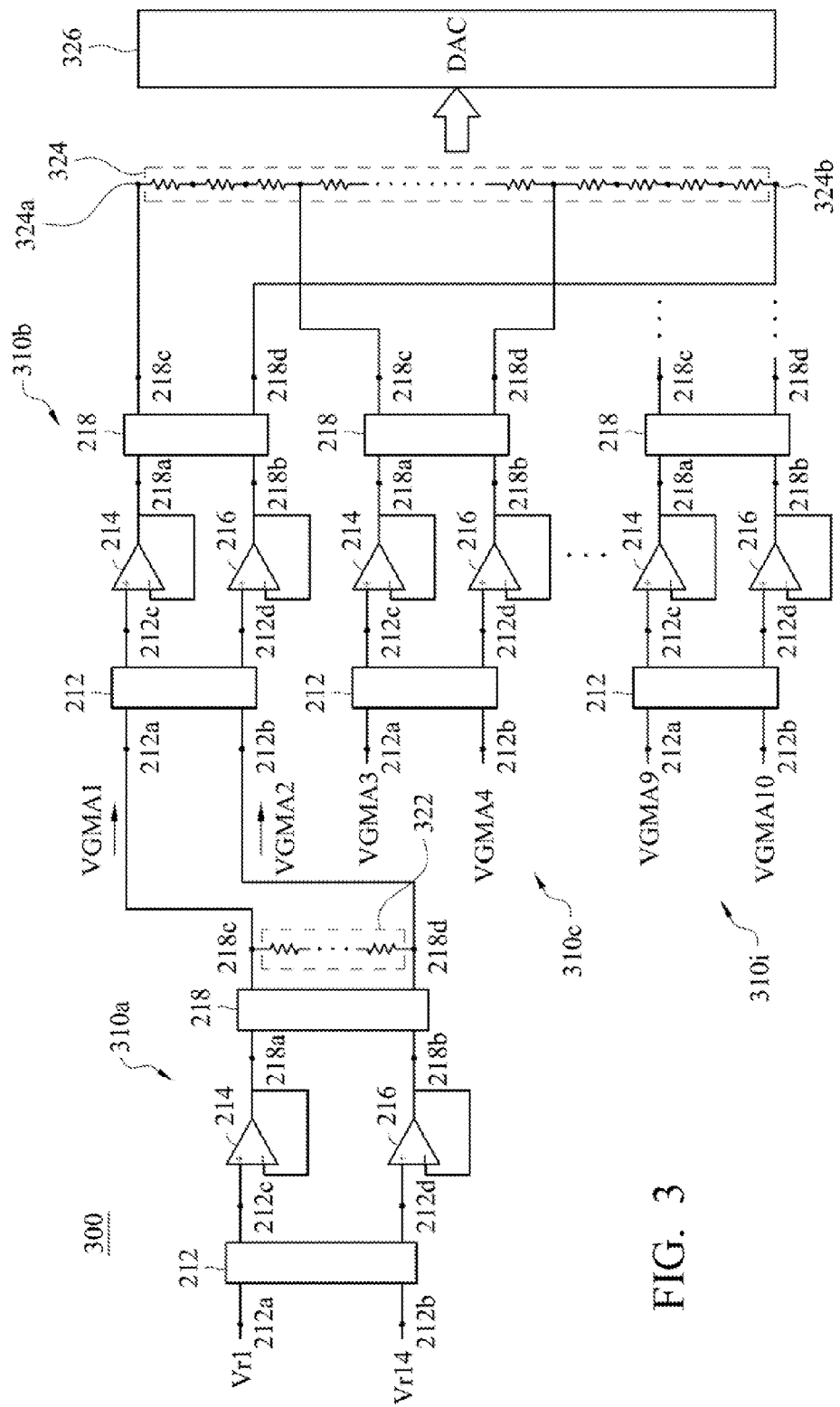
FIG. 3 is a circuit diagram showing a source driver in accordance embodiments of the present invention.

FIG. 3 is a circuit diagram showing a source driver 300 in accordance with embodiments of the present invention. The source driver 300 includes a plurality of gamma operational amplifier circuits 310a-310i, two resistor strings 322 and 324, a digital-to-analog converter 326 and other circuits such as output buffer and a switch circuit (not shown). The structure of each of the gamma operational amplifier circuits 310a-310i is substantially the same with the gamma operational amplifier circuit 210. The resistor string 322 is electrically connected between the gamma operational amplifier circuit 310a and the gamma operational amplifier circuits 310b-310i.

The resistor string 322 is configured to divide the voltage difference between the reference voltages Vr1 and Vr14 into a plurality of sub-voltages. The sub-voltages and the reference voltages Vr1 and Vr14 are used as gamma voltages and received by the gamma operational amplifier circuit 310b-310i. The gamma operational amplifier circuits 310b-310i are used as buffers for the gamma voltages. For example, the gamma operational amplifier circuit 310b receives the gamma voltages VGMA 1 and VGMA 14 to perform a buffer function for the gamma voltages VGMA 1 and VGMA 14. For another example, the gamma operational amplifier circuit 310i receives the gamma voltages VGMA 9 and VGMA 10 to perform a buffer function for the gamma voltages VGMA 9 and VGMA 10.

The resistor string 324 is electrically connected between the gamma operational amplifier circuits 310b-310i and the digital-to-analog converter 326 to provide the gamma voltages to the digital-to-analog converter 326. Further, the resistor string 324 may further divide the gamma voltages to provide more gamma voltages to the digital-to-analog converter 326. In this embodiment, the output terminals 218c of the gamma operational amplifier circuits 310b-310i are electrically connected to the resistors of the resistor string 324 in a predetermined arrangement order (begin at a first connection point 324a of the resistor string 324), and the output terminals 218d of the gamma operational amplifier circuits 310b-310i are electrically connected to the resistors of the resistor string 324 in other predetermined arrangement order (begin at a final connection point 324b of the resistor string 324).

For example, the output terminal 218c of the gamma operational amplifier circuit 310b is electrically connected to the first connection point 324a, and output terminals 218c of the gamma operational amplifier circuits 310c-310i are electrically connected to connection points between every three resistors. For another example, the output terminal 218d of the gamma operational amplifier circuit 310b is electrically connected to the final connection point 324b, and output terminals 218d of the gamma operational amplifier circuits 310c-310i are electrically connected to points between every three resistors. It is noted that the arrangement orders are not limited to this embodiment.

Figure 3A:
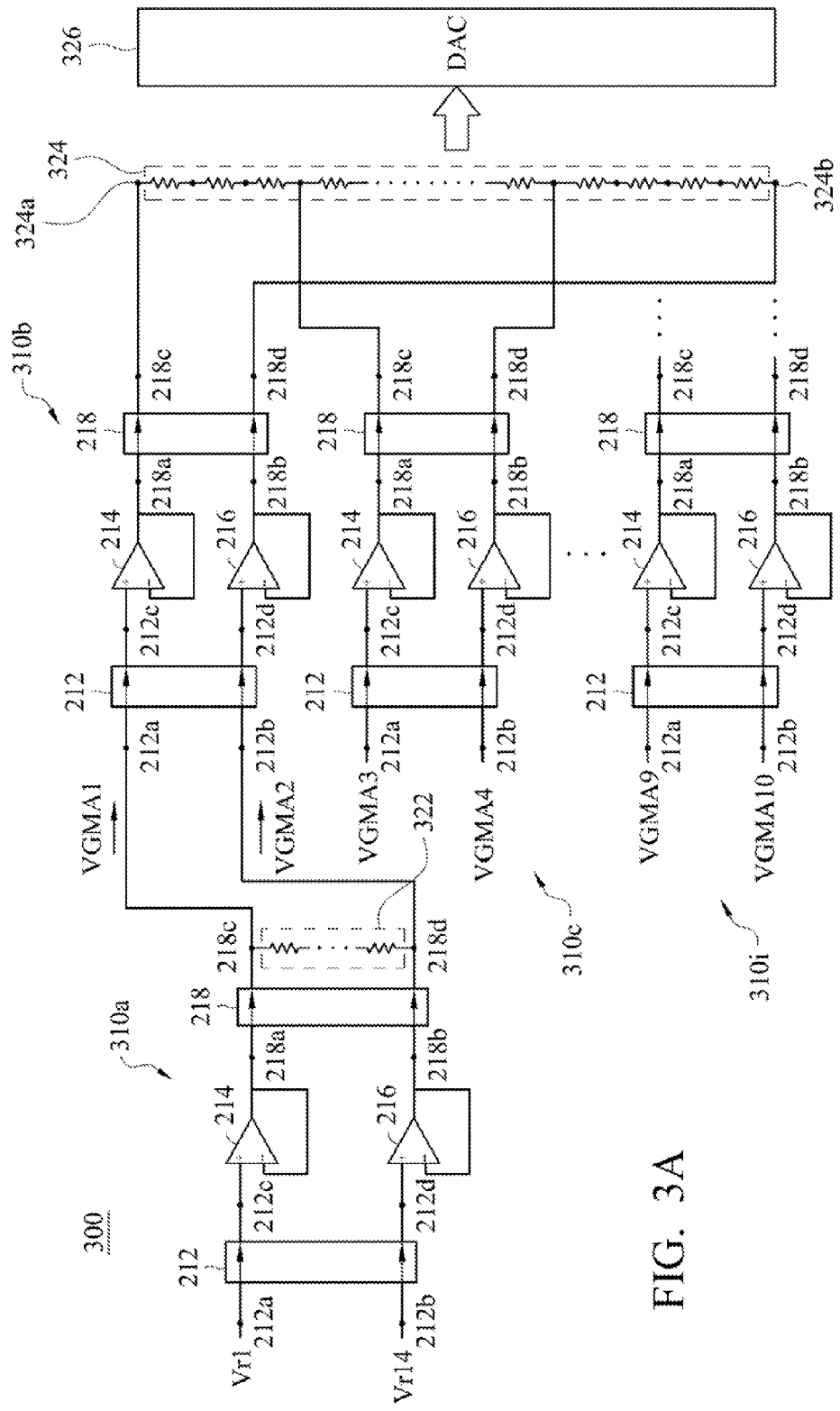
FIG. 3A and FIG. 3B are circuit diagrams showing operations of the source driver.
Figure 3B:
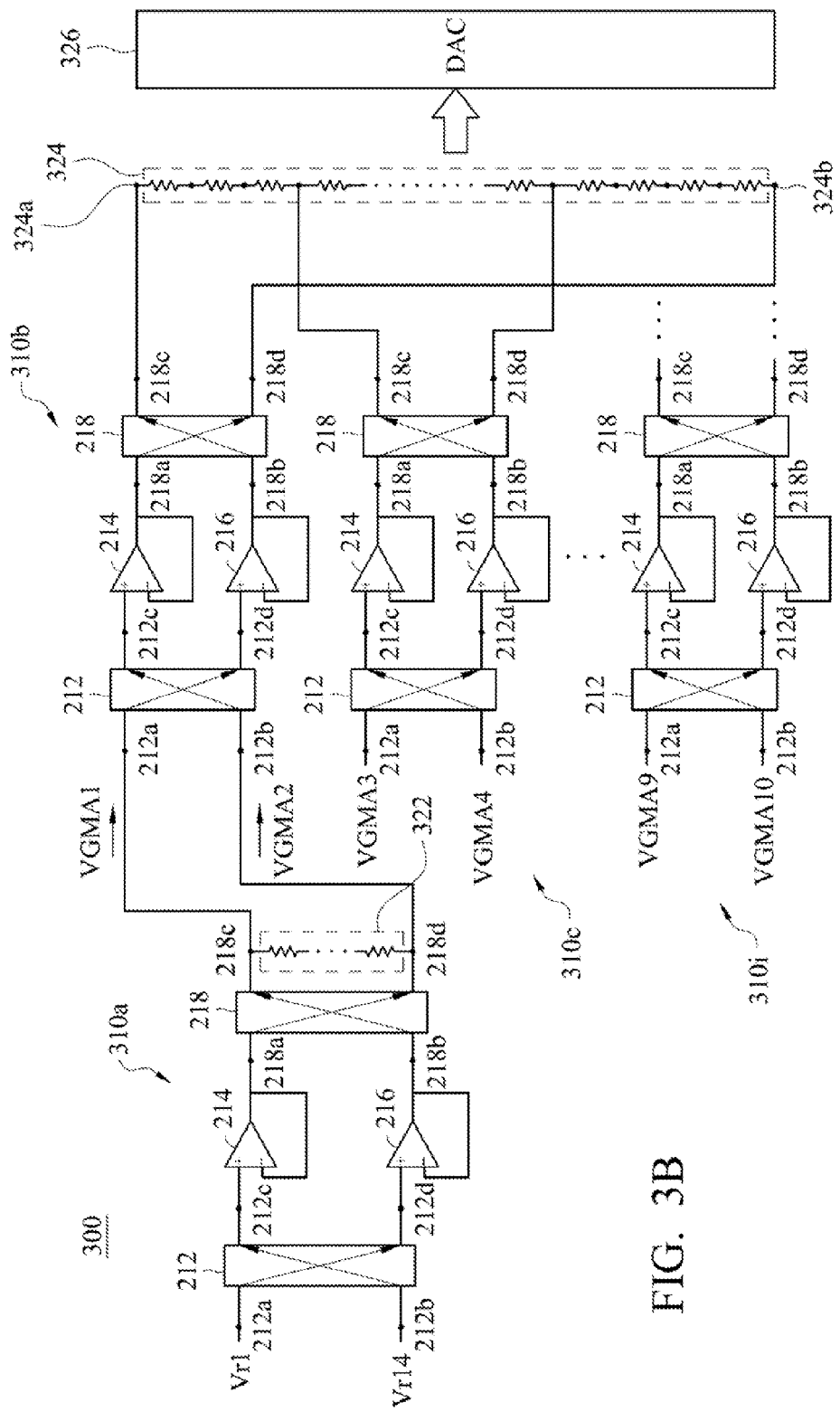

Referring to FIG. 3A and FIG. 3B, FIG. 3A and FIG. 3B are circuit diagrams showing operations of the source driver 300. The operations of the source driver 300 include a positive polarity control stage and a negative polarity control stage. The positive polarity control stage and the negative polarity control stage are switched in accordance with driving modes, such as frame inversion, row inversion, column inversion, dot inversion or two dot lines inversion and the like.

As shown in FIG. 3A, in the positive polarity control stage, the first switch circuits 212 of the gamma operational amplifier circuits 310a-310i are controlled to electrically connect the input terminals 212a to the output terminals 212c and to electrically connect the input terminals 212b to the output terminals 212d. Therefore, the positive polarity signals (for example the reference voltage Vr1 and the gama voltage VGMA 1) are presented at the output terminals 212c and the negative polarity signals (for example the reference voltage Vr14 and the gama voltage VGMA 14) are presented at the output terminals 212d. Then, the second switch circuits 218 of the gamma operational amplifier circuits 310b-310i are controlled to electrically connect the input terminals 218a to the output terminals 218c and to electrically connect the input terminals 218b to the output terminals 218d. Therefore, the positive polarity signals (for example the reference voltage Vr1 and the gama voltage VGMA 1) are presented at the output terminals 218c and the negative polarity signals (for example the reference voltage Vr14 and the gama voltage VGMA 14) are presented at the output terminals 218d.

As shown in FIG. 3B, in the negative polarity control stage, the first switch circuits 212 of the gamma operational amplifier circuits 310a-310i are controlled to electrically connect the input terminals 212a to the output terminals 212d and to electrically connect the input terminals 212b to the output terminals 212c. Therefore, the positive polarity signals (for example the reference voltage Vr1 and the gama voltage VGMA 1) are presented at the output terminals 212d and the negative polarity signals (for example the reference voltage Vr14 and the gama voltage VGMA 14) are presented at the output terminals 212c. Then, the second switch circuits 218 of the gamma operational amplifier circuits 310a-310i are controlled to electrically connect the input terminals 218a to the output terminals 218d and to electrically connect the input terminals 218b to the output terminals 218c. Therefore, the positive polarity signals (for example the reference voltage Vr1 and the gama voltage VGMA 1) are presented at the output terminals 218c and the negative polarity signals (for example the reference voltage Vr14 and the gama voltage VGMA 14) are presented at the output terminals 218d.

In the present embodiments, all the positive polarity signals before the data polarity inversion and all the negative polarity signals after the data polarity inversion pass through the same operational amplifier. Similarly, all the negative polarity signals before the data polarity inversion and all the positive polarity signals after the data polarity inversion pass through the same operational amplifier. Therefore all the positive polarity signals before the data polarity inversion and all the negative polarity signals after the data polarity inversion have the same voltage offset, and all the negative polarity signals before the data polarity inversion and all the positive polarity signals after the data polarity inversion have the same voltage offset, thereby eliminating the "band mura". In addition, regarding a display using the gamma operational amplifier circuit of embodiments of the present invention, the "band mura" is eliminated even when the display is operated in a low frame rate display mode for power saving. For example, when the display is operated in the low frame rate display mode, the switching frequency of the switch circuits of the gamma operational amplifier circuit may be decreased accordingly. However, the gamma operational amplifier circuit can eliminate the "band mura" with the decreased switching frequency.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A source driver, comprising:
a first gamma operational amplifier circuit comprising:
  a first switch circuit configured to receive a first reference voltage and a second reference voltage, wherein the first switch circuit comprises:
    a first input terminal configured to receive the first reference voltage;
    a second input terminal configured to receive the second reference voltage;
    a first output terminal configured to output one of the first reference voltage and the second reference voltage; and
    a second output signal configured to output the other of the first reference voltage and the second reference voltage;
  a first operational amplifier electrically connected to the first output terminal of the first switch circuit to output the one of the first reference voltage and the second reference voltage;
  a second operational amplifier electrically connected to the second output terminal of the first switch circuit to output the other of the first reference voltage and the second reference voltage; and
  a second switch circuit electrically connected to the first operational amplifier and the second operational amplifier, wherein the second switch circuit comprises:
    a first input terminal electrically connected to the first operational amplifier to receive the one of the first reference voltage and the second reference voltage;
    a second input terminal electrically connected to receive the other of the first reference voltage and the second reference voltage;
    a first output terminal configured to output the one of the first reference voltage and the second reference voltage; and
    a second output terminal configured to output the other of the first reference voltage and the second reference voltage;
  a first resistor string electrically connected to the first output terminal and the second output terminal of the second switch circuit, wherein the first resistor string is configured to divide a voltage difference between the first reference voltage and the second reference voltage into a plurality of sub-voltages; and
  a digital-to-analog converter electrically connected to the first resistor string to receive the sub-voltages, the first reference voltage and the second reference voltage.

2. The source driver of claim 1, further comprises:
a plurality of second gamma operational amplifier circuits electrically connected between the first resistor string and the digital-to-analog converter to receive the sub-voltages, the first reference voltage and the second reference voltage; and
a second resistor string electrically connected between the second gamma operational amplifier circuits and the digital-to-analog converter.

3. The source driver of claim 2, wherein a structure of each of the second gamma operational amplifier circuits is substantially the same with that of the first gamma operational amplifier circuit.

4. The source driver of claim 1, wherein the first operational amplifier and the second operational amplifier are rail-to-rail operational amplifiers.

5. The source driver of claim 1, wherein the first reference voltage is a positive polarity signal and the second reference voltage is a negative polarity signal matching the positive polarity signal.

6. The source driver of claim 1, wherein the first switch circuit and the second switch circuit are multiplexers.

7. A method for eliminating voltage offset, comprising:
providing a first switch circuit, a second switch circuit, a first operational amplifier and a second operational amplifier;
performing a positive polarity control stage, comprising:
  controlling the first switch circuit to output a first reference voltage to the first operational amplifier through a first output terminal of the first switch circuit and to output a second reference voltage to the second operational amplifier through a second output terminal of the first switch circuit;
  using the first operational amplifier to output the first reference voltage to a first input terminal of the second switch circuit;
  using the second operational amplifier output the second reference voltage to a second input terminal of the second switch circuit; and
  controlling the second switch circuit to output the first reference voltage through a first output terminal of the second switch circuit and to output the second reference voltage through a second output terminal of the second switch circuit; and performing a negative polarity control stage, comprising:
  controlling the first switch circuit to output the first reference voltage to the second operational amplifier through the second output terminal of the first switch circuit and to output the second reference voltage to the first operational amplifier through the first output terminal of the first switch circuit;
  using the first operational amplifier to output the second reference voltage to the first input terminal of the second switch circuit;
  using the second operational amplifier to output the first reference voltage to the second input terminal of the second switch circuit; and
  controlling the second switch circuit to output the first reference voltage through the first output terminal of the second switch circuit and to output the second reference voltage through the second output terminal of the second switch circuit;

using a resistor string to divide a voltage difference between the first reference voltage and the second reference voltage into a plurality of sub-voltages; and
  using a digital-to-analog converter to covert the sub-voltages, the first reference voltage and the second reference voltage.

8. The method of claim 7, wherein a structure of the second operational amplifier is substantially the same with that of the first operational amplifier.

9. The method of claim 7, wherein the first operational amplifier and the second operational amplifier are rail-to-rail operational amplifiers.

10. The method of claim 7, wherein the first reference voltage is a positive polarity signal and the second reference voltage is a negative polarity signal matching the positive polarity signal.

11. The method of claim 7, wherein the first switch circuit and the second switch circuit are multiplexers.

\* \* \* \* \*